(12) United States Patent
Sturcken et al.

(10) Patent No.: US 9,647,053 B2
(45) Date of Patent: May 9, 2017

(54) SYSTEMS AND METHODS FOR INTEGRATED MULTI-LAYER MAGNETIC FILMS

(71) Applicant: Ferric Inc., New York, NY (US)

(72) Inventors: Noah Andrew Sturcken, New York, NY (US); Ryan Davies, New York, NY (US)

(73) Assignee: Ferric Inc., New York, NY (US)

(*) Notice: Subject to any disclaimer, the term of this patent is extended or adjusted under 35 U.S.C. 154(b) by 0 days.

(21) Appl. No.: 14/571,649

(22) Filed: Dec. 16, 2014

(65) Prior Publication Data

US 2015/0171157 A1 Jun. 18, 2015

Related U.S. Application Data

(60) Provisional application No. 61/916,333, filed on Dec. 16, 2013.

(51) Int. Cl.
*H01L 49/02* (2006.01)
*H01L 23/522* (2006.01)
(Continued)

(52) U.S. Cl.
CPC ........ *H01L 28/10* (2013.01); *H01L 21/32051* (2013.01); *H01L 23/5223* (2013.01);
(Continued)

(58) Field of Classification Search
CPC ..... H01L 28/10; H01L 23/50; H01L 23/5223; H01L 23/5227; H01L 23/645; H01L 2924/0002; H01L 2924/00; H01L 49/02
(Continued)

(56) References Cited

U.S. PATENT DOCUMENTS

| 1,553,983 A | 9/1925 | Casper |
| 2,931,966 A | 4/1960 | Rockey |

(Continued)

FOREIGN PATENT DOCUMENTS

| FR | 2817622 A1 | 6/2002 |
| JP | 05082736 A | 4/1993 |

(Continued)

OTHER PUBLICATIONS

N. Sturcken et al., "Design of Coupled Power Inductors with Crossed Anisotropy Magnetic Core for Integrated Power Conversion".

(Continued)

*Primary Examiner* — Selim Ahmed
(74) *Attorney, Agent, or Firm* — Intrinsic Law Group

(57) ABSTRACT

Integrated multi-layer magnetic films for use in passive devices in microelectronic applications and methods of manufacture thereof. Soft ferromagnetic materials exhibiting high permeability and low coercivity are laminated together with insulating layers interposed. Electrical conductors coupled to interconnects are magnetically coupled to magnetic film layers to engender an inductor (self and mutual). Soft ferromagnetic materials are provided in an alternating array of parallel plate capacitors. Each alternating magnetic film is electrically coupled to either a primary or secondary electrical conductor interconnects and separated by an electrically insulating dielectric material. Alternatively, each alternating magnetic layer comprises an induced anisotropy material, which can also be combined with coiled conductor giving rise to a hybrid inductive/capacitive device. Also, soft ferromagnetic material are also selected and tuned to provide for FMR notch filtering.

19 Claims, 9 Drawing Sheets

(51) Int. Cl.
*H01L 23/64* (2006.01)
*H01L 21/3205* (2006.01)

(52) U.S. Cl.
CPC ........ *H01L 23/5227* (2013.01); *H01L 23/645* (2013.01); *H01L 2924/0002* (2013.01)

(58) Field of Classification Search
USPC .......................................................... 257/531
See application file for complete search history.

(56) References Cited

U.S. PATENT DOCUMENTS

| | | | |
|---|---|---|---|
| 3,614,554 | A | 10/1971 | Shield et al. |
| 5,070,317 | A | 12/1991 | Bhagat |
| 5,225,971 | A | 7/1993 | Spreen |
| 5,319,343 | A | 6/1994 | Jeffries |
| 5,583,474 | A | 12/1996 | Mizoguchi |
| 5,635,892 | A | 6/1997 | Ashby |
| 6,362,986 | B1 | 3/2002 | Schultz |
| 6,542,060 | B2 | 4/2003 | Fedeli |
| 6,542,379 | B1 | 4/2003 | Lauffer |
| 6,856,226 | B2 | 2/2005 | Gardner |
| 6,940,384 | B2 | 9/2005 | Hooey et al. |
| 7,636,242 | B2 | 12/2009 | Hazucha |
| 7,719,084 | B2 | 5/2010 | Gardner |
| 7,867,787 | B2 | 1/2011 | Gardner |
| 8,108,984 | B2 | 2/2012 | Gardner |
| 2003/0070282 | A1 | 4/2003 | Hiatt et al. |
| 2005/0088269 | A1 | 4/2005 | Hatano et al. |
| 2007/0290362 | A1 | 12/2007 | Hsu et al. |
| 2008/0003699 | A1* | 1/2008 | Gardner ................ H01F 41/046 438/3 |
| 2009/0068762 | A1* | 3/2009 | Takahashi ............. H01F 41/046 438/3 |
| 2009/0175014 | A1 | 7/2009 | Zeng et al. |
| 2009/0188104 | A1 | 7/2009 | Ching et al. |
| 2011/0279214 | A1* | 11/2011 | Lee ........................ H01F 17/08 336/220 |
| 2013/0056847 | A1 | 3/2013 | Chen |
| 2014/0027879 | A1 | 1/2014 | Weyers et al. |
| 2014/0068932 | A1 | 3/2014 | Sturcken |
| 2014/0071636 | A1* | 3/2014 | Sturcken ................ H05K 1/115 361/748 |
| 2014/0203398 | A1 | 7/2014 | Sturcken |
| 2015/0036308 | A1 | 2/2015 | Sturcken |

FOREIGN PATENT DOCUMENTS

| | | |
|---|---|---|
| JP | 05291063 | 11/1993 |
| JP | H09162354 A | 6/1997 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.

* cited by examiner

SYSTEMS AND METHODS FOR INTEGRATED MULTI-LAYER MAGNETIC FILMS

RELATED APPLICATIONS

The present application derives from and claims priority to U.S. Provisional Application No. 61/916,333, filed on Dec. 16, 2013, bearing the present title.

TECHNICAL FIELD

The present application is directed to multiple layer devices made from magnetic films and methods of manufacture for use in applications such as microelectronics.

BACKGROUND

The increase in computing power, spatial densities in semiconductor based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency. Most efforts to improve the energy efficiency of microelectronic devices has been at the chip and transistor level, including with respect to transistor gate width. However, these methods are limited and other approaches are necessary to increase device density, processing power and to reduce power consumption and heat generation in the same.

One field that can benefit from the above improvements is in switched inductor power conversion devices. Power supplies include power converters that convert one form of electrical energy to another. A regulated power supply is one that controls the output voltage or current to a specific value; the controlled value is held nearly constant despite variations in either load current or the voltage supplied by the power supply's energy source.

Power supplies for electronic devices can be broadly divided into line-frequency (also called "conventional" or "linear") and switching power supplies. Conventional power supplies are usually a relatively simple design, but they become increasingly bulky and heavy for high-current equipment. This is due to the need for large mains-frequency transformers and heat-sinked electronic regulation circuitry. Linear voltage regulators produce regulated output voltage by means of an active voltage divider that consumes energy, thus making efficiency low.

A switched-mode power supply of the same rating as a conventional power supply maintains a smaller footprint with better efficiency but at the expense of being more complex. In a switched-mode power supply (SMPS), the AC mains input is directly rectified and then filtered to obtain a DC voltage. The resulting DC voltage is then switched on and off at a high frequency by electronic switching circuitry, thus producing an AC current that will pass through a high-frequency transformer or inductor.

Switching occurs at a very high frequency (typically 10 kHz-1 MHz), thereby enabling the use of transformers and filter capacitors that are much smaller, lighter, and less expensive than those found in linear power supplies operating at mains frequency. After the inductor or transformer secondary, the high frequency AC is rectified and filtered to produce the DC output voltage.

Switched-mode power supplies are usually regulated, and to keep the output voltage constant, the power supply employs a feedback controller that monitors current drawn by the load. The switching duty cycle increases as power output requirements increase which puts increasing demands on the constituent components, particularly the inductors. Switch-mode power supplies also use filters or additional switching stages in the incoming rectifier circuit to improve the waveform of the current taken from the AC line. This adds to the circuit complexity, with the inclusion of additional inductors and capacitors.

Additionally, the delivery of low voltage/high current power is also challenging because power loss increases with higher currents, pursuant to Ohm's law:

$$P_{loss} = I^2 R$$

where, $P_{loss}$ is the power loss over the length of wire and circuit trace, I is the current and R is the inherent resistance over the length of wire and circuit trace. As such, and to increase overall performance, there has been a recognized need in the art for large scale integration of compact and dense electrical components at the chip level, such as, for use with the fabrication of complementary metal oxide semiconductors (CMOS).

With the development of highly integrated electronic systems that consume large amounts of electricity in very small areas, the need arises for new technologies which enable improved energy efficiency and power management for future integrated systems. Integrated power conversion is a promising potential solution as power can be delivered to integrated circuits at higher voltage levels and lower current levels. That is, integrated power conversion allows for step down voltage transformers to be disposed in close proximity to transistor elements.

Unfortunately, practical integrated inductors that are capable of efficiently carrying large current levels for switched-inductor power conversion are not available. Specifically, inductors that are characterized by high inductance (>1 nH), low resistance (<1 Ohm), high maximum current rating (>100 mA), and high frequency response whereby no inductance decrease for alternating current (AC) input signal greater than 1 MHz are unavailable or impractical using present technologies.

Furthermore, all of these properties must be economically achieved in a small area, typically less than 1 mm², a form required for CMOS integration either monolithically or by 3D or 2.5D chip stacking. Thus, an inductor with the aforementioned properties necessary in order to implement integrated power conversion with high energy efficiency and low output voltage ripple which engenders periodic noise in the output of the converter's output.

The use of high permeability, low coercivity material is typically required to achieve the desired properties on a small scale. In electromagnetism, permeability is the measure of the ability of a material to support the formation of a magnetic field within itself. In other words, it is the degree of magnetization that a material obtains in response to an applied magnetic field. A high permeability denotes a material achieving a high level of magnetization for a small applied magnetic field.

Coercivity, also called the coercive field or force, is a measure of a ferromagnetic or ferroelectric material to withstand an external magnetic or electric field. Coercivity is the measure of hysteresis observed in the relationship between applied magnetic field and magnetization. The coercivity is defined as the applied magnetic field strength necessary to reduce the magnetization to zero after the magnetization of the sample has reached saturation. The coercivity is the intensity of the applied magnetic field required to reduce the magnetization of that material to zero after the magnetization of the sample has been driven to saturation. Thus coercivity measures the resistance of a ferromagnetic material to becoming demagnetized. Ferromagnetic materials with high coercivity are called magnetically hard materials, and are used to make permanent magnets.

Coercivity is determined by measuring the width of the hysteresis loop observed in the relationship between applied magnetic field and magnetization. Hysteresis is the dependence of a system not only on its current environment but also on its past environment. This dependence arises because the system can be in more than one internal state. When an external magnetic field is applied to a ferromagnet such as iron, the atomic dipoles align themselves with it. Even when the field is removed, part of the alignment will be retained: the material has become magnetized. Once magnetized, the magnet will stay magnetized indefinitely. To demagnetize it requires heat or a magnetic field in the opposite direction.

High quality inductors are typically made from high permeability, low coercivity material. However, high permeability materials tend to saturate when biased by a large direct current (DC) magnetic field. Magnetic saturation can have adverse effects as it results in reduced permeability and consequently reduced inductance.

Accordingly, there is a need for high quality inductors to be used in large scale CMOS integration. This provides a platform for the advancement of systems comprising highly granular dynamic voltage and frequency scaling as well as augmented energy efficiency. The present disclosure contemplates the novel fabrication of efficient and compact on-chip inductors and capacitors, practical methods for manufacturing thereof and remedying these and/or other associated problems.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

As mentioned above, the present invention relates to new and improved methods and apparatus for providing integrated multi-layer magnetic films. In particular, magnetic films are comprised by inductors, capacitors and hybrids thereof to be used on-chip in microelectronic applications.

According to one aspect of the invention, a set of soft ferromagnetic laminations are provided with two or more comprising Co, Ni or Fe, or a combination thereof. Soft ferromagnetic materials generally exhibit a high permeability and a low coercivity. Permeability is the relationship between applied magnetic field and magnetization of the material, where a high permeability suggests the material achieves a high level of magnetization for a small applied magnetic field. These materials achieve a magnetic coercivity less than 2 $O_e$ along the hard axis of magnetization. Soft ferromagnetic materials have a number of useful applications within circuits and microelectronic applications. High permeability and low coercivity are two properties that are useful for enhancing inductance. Inductance is a physical phenomenon that can be explained by the combination of Oested's law, that an electric current in a conductor creates a proportional magnetic field, and Faraday's law, that a time varying magnetic flux induces an electric potential in nearby conductors. The consequence of inductance is that a change in electric current through a conductor will result in an induced electric potential that resists the change in current. Soft magnetic materials exhibit a high permeability and consequently can be placed in proximity to conductors in order to increase inductance values.

A low coercivity for the material reduces the losses that may be incurred by repeatedly changing the magnetization of the magnetic material. Methods and techniques are used to ensure that the high permeability and low coercivity of the material is maintained over specific ranges of frequency and applied magnetic field strength. These techniques are also employed to suppress the formation of eddy currents and minimize other loss mechanisms over potential operating conditions. Electrically insulating materials are inserted into the magnetic film, separating the film into two or more thin (1 nm to 500 nm) laminations that are electrically isolated. The insulating layers can suppress the formation of eddy currents, which is a major source of loss at high frequencies. In addition or in the alternative, the insulating layers can promote dipolar coupling between adjacent magnetic films, which is desirable because it provides for magnetic flux closure between the magnetic laminations. Without dipolar coupling, flux closure will occur within individual magnetic laminations, which leads to a larger number of magnetic domains and consequently a larger number of domain walls, increasing the coercivity of the film.

The present devices include laminations of soft magnetic material that are separated by an electrically insulating material and are placed or built into the electrical interconnect layers of an integrated circuit. In accordance one aspect, the laminated ferromagnetic film is magnetically coupled to other circuit elements in the integrated circuit. In another, the laminated ferromagnetic film is electrically coupled to other circuit elements in the integrated circuit.

The soft ferromagnetic laminations will be between 1 nm and 500 nm in thickness, but preferably 100 nm to 300 nm for switched inductor power conversion applications (dependent on material conductivity). This range of layer thicknesses will largely suppress eddy current formation in the magnetic structure for the frequency range of 100 MHz to 300 MHz. This allows inductive elements to have peak quality factor in the identical frequency range and is appropriate for efficient switch mode power conversion when coupled with modern transistors that are available in CMOS technologies with channel length less than 200 nm.

According to another aspect of the present invention, a set of soft ferromagnetic laminations are provided with two or more comprising Co, Ni or Fe, or a combination thereof. These materials achieve a magnetic coercivity less than 2 $O_e$ along the hard axis of magnetization. The laminations are separated by an electrically insulating material and are placed or built into the electrical interconnect layers of an integrated circuit. This laminated ferromagnetic film is magnetically and/or electrically coupled to other circuit elements in the integrated circuit.

The soft ferromagnetic laminations will be between 1 nm and 500 nm in thickness, but preferably between 1 nm to 50 nm for tunable ferromagnetic resonance (FMR) filter applications. These will largely suppress eddy current formation in the magnetic structure for the frequency range of 500

MHz to 3 GHz and allow for high quality factor filtering of specific spectral content without suppressing spectral content in adjacent bands.

According to another aspect, the forgoing described devices are modified so that alternating magnetic layers are electrically coupled to a primary electric terminal, with all other magnetic layers being electrically coupled to a secondary electric terminal. In this manner a set of parallel plate capacitors may be formed that use the insulating layers that separate the magnetic laminations for electric field storage.

According to alternate aspect, the forgoing described devices are modified so that alternating magnetic layers comprise a second magnetic alloy, which different magnetic properties from the first. The primary magnetic material exhibits a high relative permeability, greater than 500μ. A secondary magnetic material exhibits a high induced anisotropy, greater than 10 $O_e$ and more likely greater than 20 $O_e$. The combined pair of different magnetic materials provides a desirable balance between permeability and induced anisotropy which is desirable for specific device designs.

According to yet another aspect, element of the last two preceding embodiments are combined. The resultant device comprises one or more pairs of magnetic laminations; where a pair comprises a primary and secondary material. The primary material exhibits a high permeability and the secondary material exhibits a high-induced anisotropy. Each lamination of the primary material is electrically coupled to a primary electrical terminal. And each lamination of secondary magnetic material is electrically coupled to a secondary electrical terminal. The resultant device is a magnetic multilayer stack that allows for optimization of induced anisotropy and magnetic permeability. It also provides electrical charge storage in the form of parallel plate capacitors that are created between laminations of the primary and secondary magnetic materials.

IN THE DRAWINGS

Figure 5:
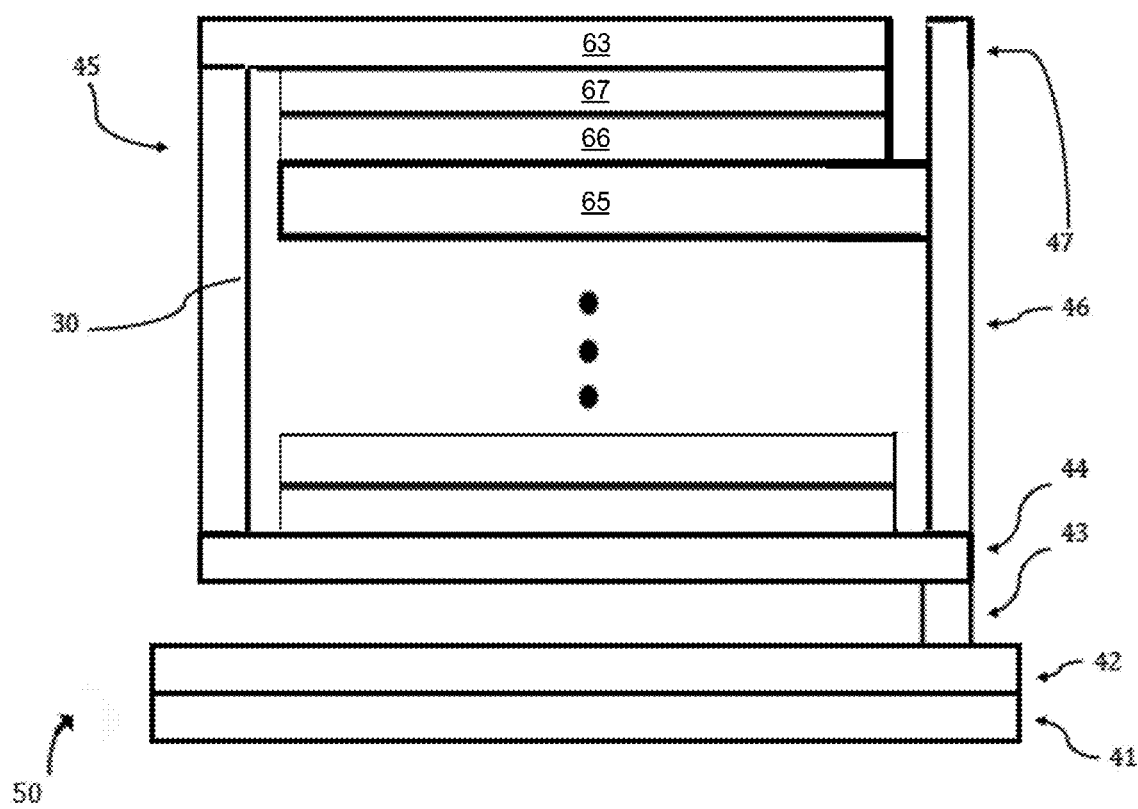
Figure 6:
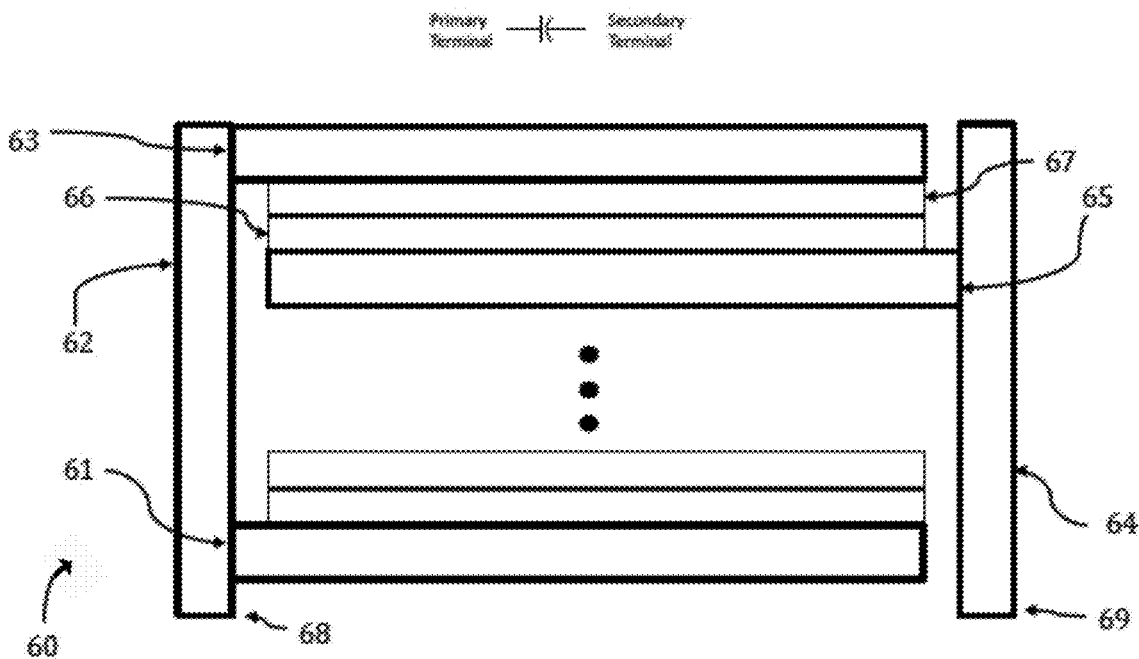
Figure 7:
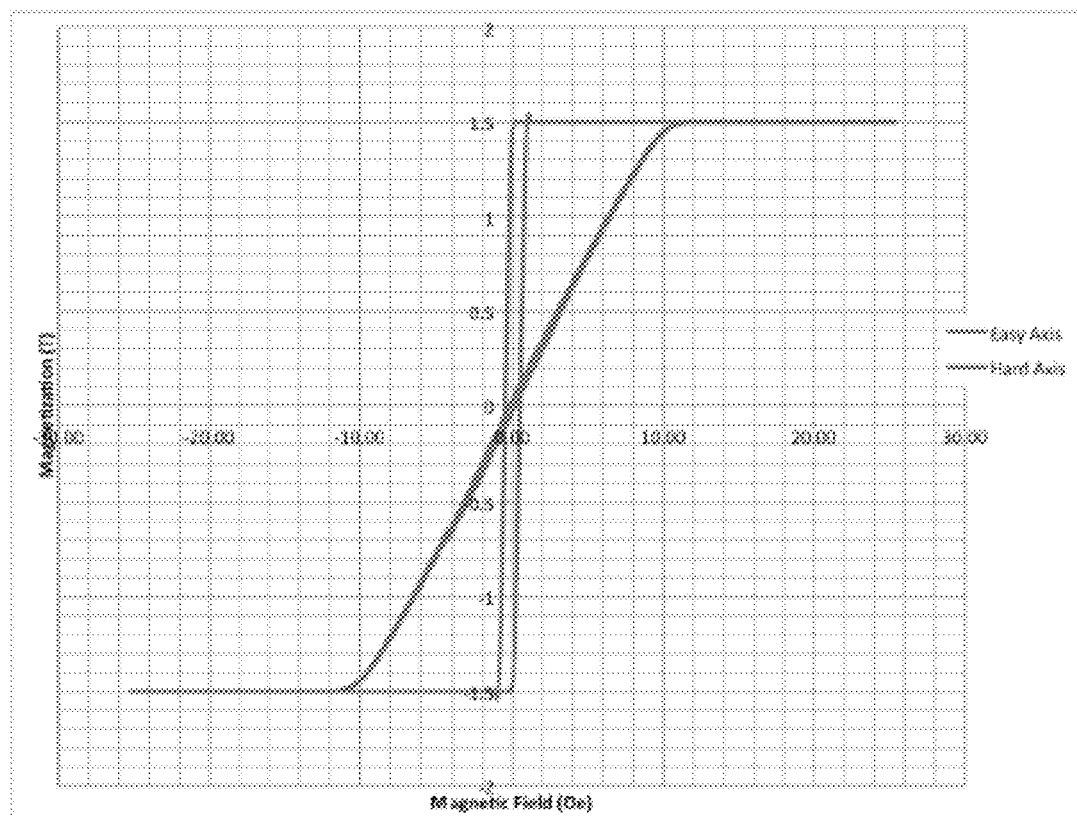
Figure 8:
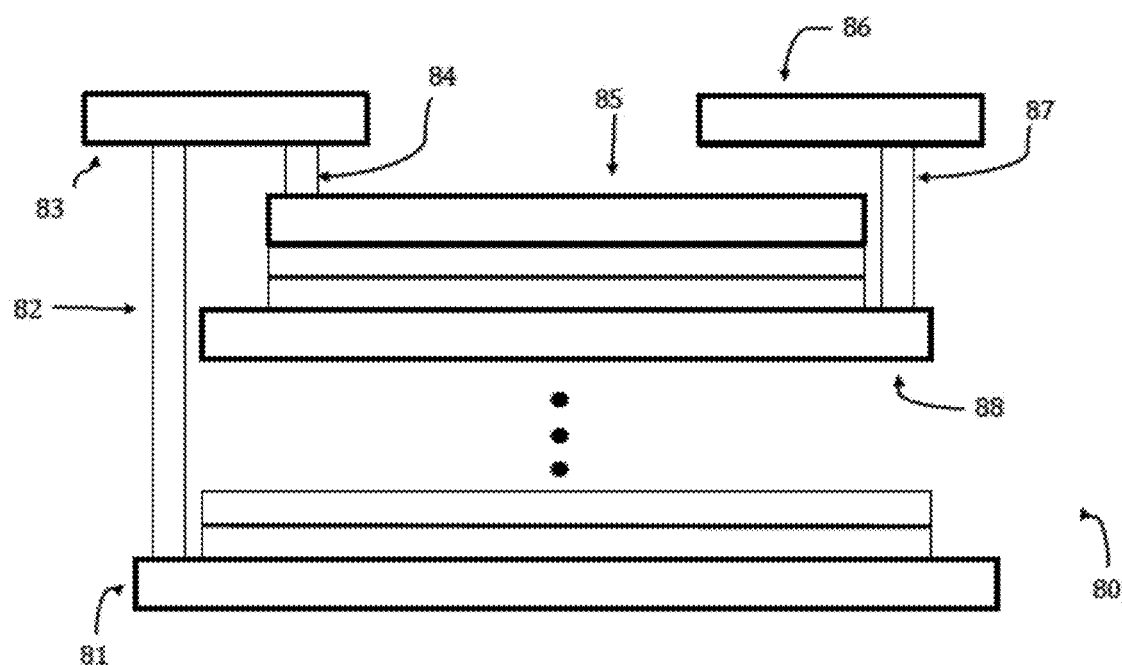
Figure 9:
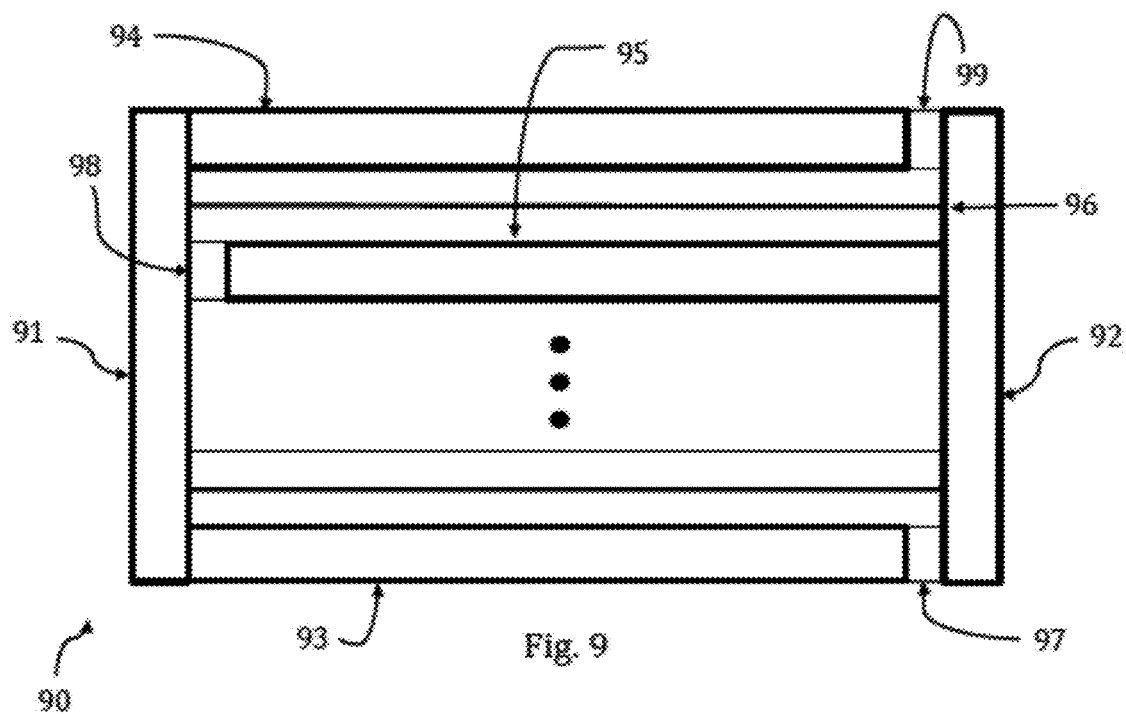

FIG. 5 portrays an exemplary laminated, integrated inductor;

FIG. 6 depicts an abstraction of an exemplary laminated, integrated capacitor;

FIG. 7 graphically illustrates the juxtaposition of hysteresis loops for the hard and soft axes in a soft ferromagnetic material;

FIG. 8 depicts on possible implementation of an exemplary laminated, integrated capacitor; and, FIG. 9 demonstrates on exemplary method for fabricating a laminated, integrated capacitor.

DETAILED DESCRIPTION

As mentioned above, the present invention relates to multiple layer devices made from magnetic films and methods of manufacture thereof. In particular, inductors and capacitors comprise laminated magnetic films for use in on-chip in microelectronic applications. One or more embodiments or implementations are hereinafter described in conjunction with the drawings, where like reference numerals are used to refer to like elements throughout, and where the various features are not necessarily drawn to scale.

The present invention discloses a novel inductor which can be integrated into large scale chip fabrication, according to one embodiment. Inductance is the property of a conductor by which a change in current in the conductor "induces" (creates) a voltage (electromotive force) in both the conductor itself (self-inductance) and in any nearby conductors (mutual inductance). These effects are derived from two fundamental observations of physics: first, that a steady current creates a steady magnetic field (Oersted's law), and second, that a time-varying magnetic field induces voltage in nearby conductors (Faraday's law of induction).

To add inductance to a circuit, electrical or electronic components called inductors are used. An inductor, also called a coil or reactor, is a passive two-terminal electrical component which resists changes in electric current passing through it. It consists of a conductor such as a wire, usually wound into a coil. When a current flows through it, energy is stored temporarily in a magnetic field in the coil. When the current flowing through an inductor changes, the time-varying magnetic field induces a voltage in the conductor, according to Faraday's law of electromagnetic induction, which opposes the change in current that created it.

Inductors increase their constituent magnetic fields by way of magnetic cores made of soft ferromagnetic materials inside the coil. A magnetic core can increase the inductance of a coil by a factor of several thousand, by increasing the magnetic field due to its higher magnetic permeability. However the magnetic properties of the core material cause several side effects that alter the behavior of the inductor which are described by the following and addressed by the present invention.

As discussed, a time-varying current in a ferromagnetic inductor produces a time-varying magnetic field in its core. Energy losses occur in the core material (core loss) due to magnetic field change which are dissipated as heat. Core losses arise in the based two conditions: eddy currents and hysteresis. A changing magnetic field induces circulating loops of electric current in the conductive metal core (Faraday's law). The currents dissipate into heat as a function of any nominal resistance associated with core material. The amount of energy loss is proportional to the area inside the loop of current.

Changing or reversing the magnetic field in the core also causes losses due to the motion of the tiny magnetic domains it is composed of. The energy loss is proportional to the area of the hysteresis loop in the BH graph of the core material. Materials with low coercivity have narrow hysteresis loops and corresponding low hysteresis losses. Energy loss per cycle of alternating current is constant. As such, core losses increase linearly with frequency.

Another concern addressed by the present invention is a condition of nonlinearity. High currents in a ferromagnetic core coil produces magnetic core saturation. In a saturated state, the inductance does not remain constant but changes with the current through the device. This is called nonlinearity and results in distortion of the signal.

The varying field in an inductor may also induce an electromotive force (emf) in neighboring circuits (mutual inductance) which is useful in transformers. A transformer is a static electrical device that transfers energy by inductive coupling between its winding circuits. A varying current in the primary winding creates a varying magnetic flux in the transformer's core and thus a varying magnetic flux through the secondary winding. This varying magnetic flux induces a varying electromotive force or voltage in the secondary winding. Transformers can be used to vary the relative voltage of circuits or isolate them, or both.

Figure 1:
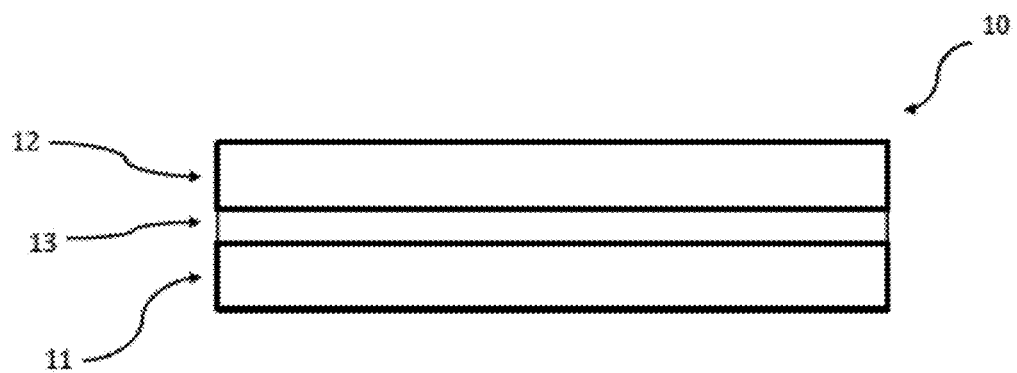
FIG. 1 illustrates an exemplary elementary laminated magnetic stack.

FIG. 1 illustrates an exemplary an elementary laminated magnetic stack 10 according to one embodiment of the present invention. Magnetic film layers 11, 12 are laminated together separated by an electrically insulating layer 13. Magnetic film layers 11, 12 comprise soft ferromagnetic materials. Soft ferromagnetic materials have a number of useful applications within circuits and microelectronic applications. They exhibit high permeability and low coercivity; two properties that are useful for enhancing inductance.

In an aspect, laminations of soft magnetic materials are integrated with other electronic circuits on a single, or multiple semiconductor substrates, in order to improve inductance, or provide additional functionality that would not otherwise be available on an integrated circuit. Specifically, the integration of magnetic films enables efficient switched inductor power conversion. The laminated magnetic film is magnetically coupled to a coil or a VIA that is composed of one or more layers of electrical conductor, in order to provide a high quality inductance with low resistance through the conductive element.

Soft magnetic materials exhibit a high permeability and consequently can be placed proximal to conductors in order to increase inductance values. Low coercivity mitigates core losses that are incurred by repeatedly changing the magnetization of the magnetic material. Methods and techniques are used to ensure that the high permeability and low coercivity of the material are maintained over specific ranges of frequency and applied magnetic field strengths. These techniques are also employed to suppress the formation of eddy currents and minimize other loss mechanisms over potential operating conditions.

Electrically insulating layer 13 comprises an electrical insulating material. An electrical insulator is a material whose internal electric charges do not flow freely. An electrical insulator, therefore, does not conduct an electric current under the influence of an electric field. It is characterized by a low conductivity/high resistivity. Exemplary materials include glass, paper and Teflon, which have high resistivity marking them very good electrical insulators. In one or more embodiments, electrically insulating layers comprises photoresist, metal oxide, silicon dioxide, polymer or other suitable material suitably used in semiconductor device fabrication. In some embodiments, the electrically insulating layer 13 comprises an oxide (or other variant) of a first magnetic material used for magnetic film layer 11 and/or 12. Such an oxide can be formed by exposing the underlying magnetic film layer 11 to an oxygen-rich environment, which can promote the growth of a thermal oxide as electrically insulating layer 13. Alternatively, the electrically insulating layer 13 can be formed by depositing the first magnetic material in an oxygen-rich environment so that the first magnetic material is oxidized as it is deposited to form electrical insulating layer 13.

The use of an oxide (or other variant) of the first magnetic material can provide benefits in manufacturing cost and throughput by reducing the total number of unique deposition process employed in device fabrication. In addition or in the alternative, the use of an oxide of the first magnetic material can provide benefits in device reliability because the material similarities between the first magnetic material (deposited as magnetic film layer 11 and/or 12) and an oxide of the first magnetic material (deposited as electrically insulating layer 13) can improve adhesion there between (i.e., adhesion between electrically insulating layer 13 and magnetic film layer 11 and/or 12). Also, an oxide of the first magnetic material can reduce mechanical stress at the interfaces between electrically insulating layer 13 and magnetic film layer 11 and/or 12. If adhesion between adjacent material laminations is poor, the material stack may delaminate during device fabrication or during use in the field by the end user. If significant mechanical film stress (e.g., less than −250 MPa (compressive stress) or greater than 250 MPa (tensile stress)) is present at these interfaces, such mechanical film stress can negatively impact the magnetic properties of magnetic film layer 11 and/or 12 when the materials composing those layers exhibit non-zero magnetostriction, which is the physical phenomenon that relates film stress and magnetization in ferromagnetic materials.

Electrically insulating materials are inserted into the magnetic film layers 11, 12, separating the film into two or more thin (1 nm to 500 nm) laminations that are electrically isolated. The thickness of electrically insulating layer 13 can be selected to provide adequate resistance between any two adjacent magnetic laminations to suppress eddy currents, and also to promote dipolar coupling between adjacent magnetic laminations. The thickness of electrically insulating layer 13 can be determined by the material system of the layer 13, the method of material synthesis, the quality of the insulating layer 13/magnetic film layer 11, 12 interface and/or the electrical properties of the insulating layer 13. For the purpose of reducing eddy current losses, the combined thickness and resistivity of the insulating layer 13 can be selected so that the skin depth for the laminated magnetic core is greater than the thickness of a single magnetic lamination. Eddy currents can be a major source of loss at high frequencies. In addition or in the alternative, the electrically insulating layer 13 can promote dipolar coupling between adjacent magnetic laminations (e.g., magnetic film layers 11 and 12). Dipolar coupling between adjacent magnetic laminations is desirable because it can provide for magnetic flux closure between the magnetic laminations. Without dipolar coupling, flux closure can occur within individual magnetic laminations, which can lead to a larger number of magnetic domains and consequently a larger number of domain walls, increasing the coercivity of the magnetic film layer. When a closed path for magnetic flux is formed between two adjacent magnetic laminations, there can be reduced occurrence of magnetic domain walls and, consequently, there can be improved magnetic coercivity for the structure.

Figure 2A:
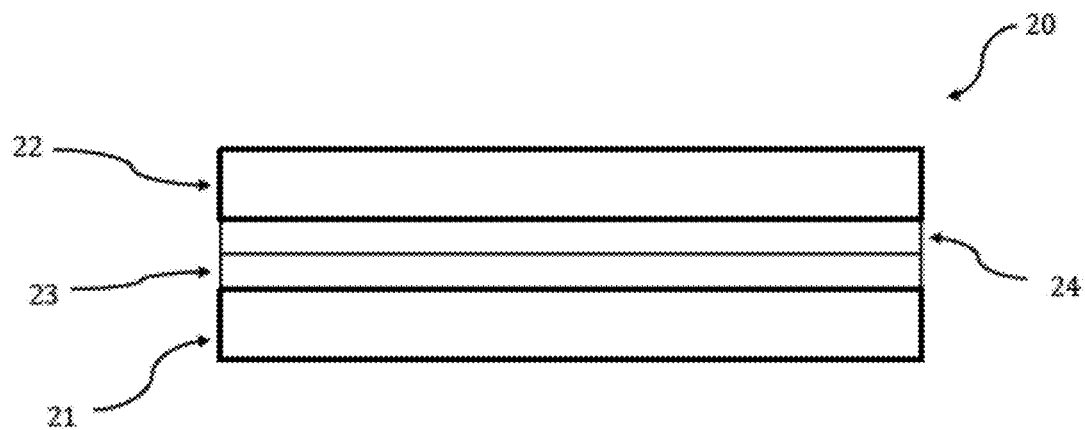
FIGS. 2A and 2B depict exemplary elementary laminated magnetic stacks.

FIG. 2A depicts an exemplary elementary laminated magnetic stack 20 according to an alternate embodiment. Elementary laminated magnetic stack 20 further comprises an interface layer 24, in addition to magnetic film layers 21, 22 and electrically insulating layer 23. Interface layer 24 can be used in the fabrication process to help deposit magnetic film layer 22 onto electrically insulating layer 23. The material composing interface layer 24 can be selected to improve adhesion and/or reduce roughness at the interface between magnetic layer 22 and insulating layer 23. Reducing the roughness at the interface of magnetic layer 22 and insulating layer 23 can reduce coercivity for the magnetic stack 20. Improving the adhesion between magnetic layer 22 and insulating layer 23 can reduce the potential for film delamination. Additionally, interface layer 24 can serve as a diffusion barrier or getter between magnetic layer 22 and insulating layer 23 to prevent the diffusion of material constituents from insulating layer 23 to magnetic layer 22. Finally, interface layer 23 can be chosen to reduce or compensate mechanical film stress in the magnetic stack 20.

Interface layer 24 can be comprised of one or more of Ta, Ti, W, Cr or Pt, or a combination thereof, depending on the particular choice of magnetic material and interface layer.

Figure 2B:
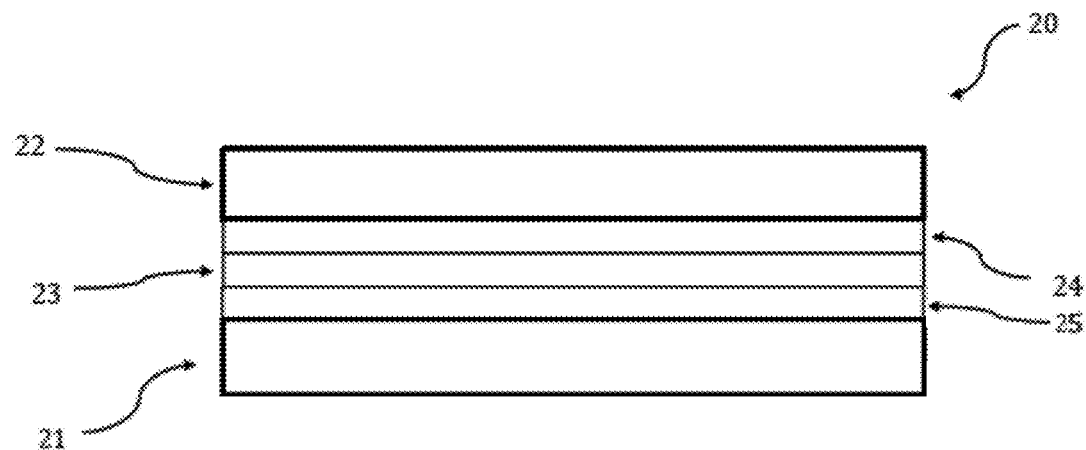

FIG. 2B depicts an exemplary elementary laminated magnetic stack 20 according to an alternate embodiment. Elementary laminated stack 20 further comprises an additional interface layer 25 between magnetic film 21 and insulating layer 23. This interface layer 25 can promote improved adhesion between magnetic film layer 21 and insulating layer 23, and can also prevent the diffusion of the material constituents between magnetic film layer 21 and insulating layer 23.

Figure 3:
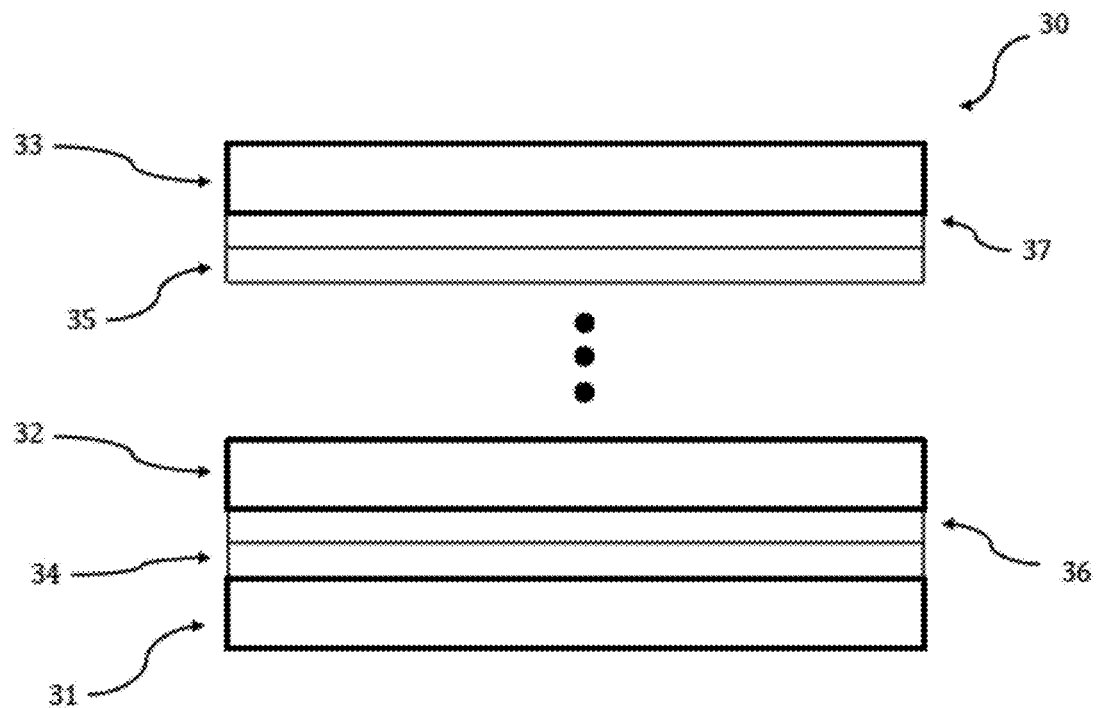
FIG. 3 illustrates an abstraction of an exemplary laminated magnetic stack.

FIG. 3 illustrates an abstraction of an exemplary laminated plurality stack 30 depicting more than two (N) laminations of soft magnetic material layers 31, 32, 33. Each material layer 31, 32, 33 is separated by insulating layers 34, 35 and interface layers 36, 37 pursuant to the elementary laminated magnetic stack 20 in FIG. 2. For example, soft magnetic material layers 31, 32 are separated by insulating layer 34 and interface layer 36 and so forth. One in art can appreciate the limit to number N of stacks is a practical, engineering consideration.

As illustrated in FIG. 3, first insulating layer 34 is disposed between first magnetic layer 31 and second magnetic layer 32. First interface layer 36 is disposed between the first magnetic layer 31 and the second magnetic layer 32. Specifically, the first interface layer 36 is disposed between the second magnetic layer 32 and the first insulating layer 34. Alternatively, the first interface layer 36 can be disposed between the first magnetic layer 31 and the first insulating layer 34.

Laminated plurality stack 30 also includes third magnetic layer 33 where the second magnetic layer 32 is disposed between the first magnetic layer 31 and the third magnetic layer 33. Second insulator 35 is disposed between the second magnetic layer 32 and the third magnetic layer 33. Second interface layer 37 is disposed between the second magnetic layer 32 and the third magnetic layer 33. Specifically, the second interface layer 37 is disposed between the third magnetic layer 33 and the second insulating layer 35. Alternatively, the second insulating layer 33 can be disposed between the third magnetic layer 33 and the second interface layer 37.

Laminated plurality stack 30 can include a fourth (or additional) magnetic layer where the third magnetic layer 33 is disposed between the second magnetic layer 32 and the fourth magnetic layer 33. An insulator layer and/or an interface layer can be included between the fourth magnetic layer and the third magnetic layer 33 in the same arrangement as the rest of the laminated plurality stack 30 described above.

Laminations of soft magnetic materials are integrated with other electronic circuits on a single, or multiple semiconductor substrates, in order to improve inductance, or provide additional functionality that would not otherwise be available on an integrated circuit. Specifically, the integration of magnetic films enables efficient switched inductor power conversion. The laminated magnetic film is magnetically coupled to a coil or strip line that is composed of one or more layers of electrical conductor, in order to provide a high quality inductance with low resistance through the conductive element.

Figure 4:
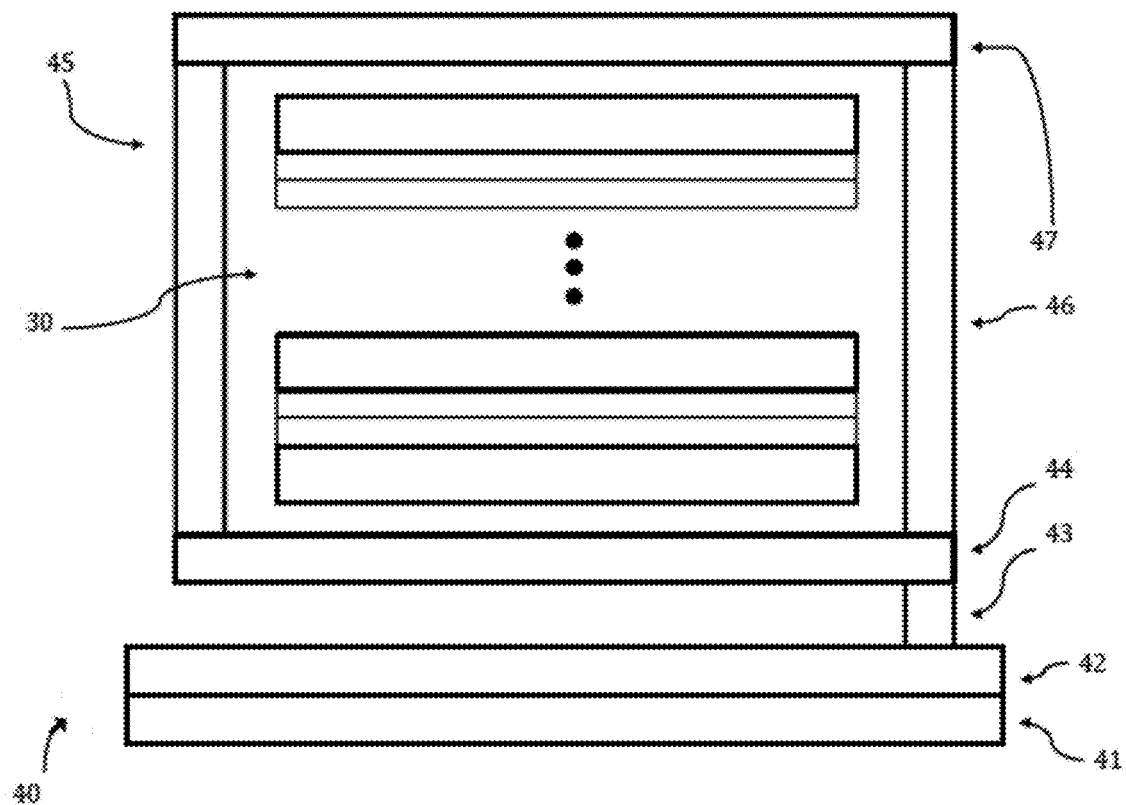
FIG. 4 is a graphical abstraction of an exemplary laminated, integrated inductor.

FIG. 4 is a graphical abstraction of an exemplary laminated, integrated inductor 40 disposed on a silicon substrate 41. At the heart of the integrated inductor 40 is laminated plurality stack 30. Laminated plurality stack 30 is disposed under and on top but electrically insulated from electrical conduction layers 44, 47. The conductor in the present embodiment are electrically conductive vertical interconnect accesses (VIAs) 45, 46 and are in electrical communication (e.g., in direct or indirect connection) with electrical conduction layers 44, 47, at least in part. However, electrical interconnect 44, 45, 46, 47 can be any suitable electrical conductor such as a trace, wire or VIA. Depending on application, the electrical interconnect 44, 45, 46, 47 is constructed to compose one or more coils, with magnetic core 30 at the center. In some embodiments, the electrical conduction layers 44, 47 are in electrical contact (e.g., in direct physical contact) with VIAs 45, 46.

The electrical interconnect 44, 45, 46, 47 that compose one or more inductor coils are magnetically coupled to laminated stack 30. Power is transmitted between front-end-of-line (FEOL) transistor layer 42 and the one or more inductors composed of 30, 44, 45, 46, 47 through electrical interconnect 43. Electrical interconnect layers 44, 47 and VIA layers 45, 46 are a cross-section of an electrical winding that wraps around the laminated plurality stack 30 to form an inductor as described above. FEOL is the first portion of integrated circuit (IC) fabrication where the individual devices (transistors, capacitors, resistors, etc.) are patterned in the semiconductor. FEOL generally covers everything up to (but not including) the deposition of metal interconnect layers 44, 47.

FIG. 5 is a graphical illustration of a laminated, integrated inductor 50. The inductor 50 includes magnetic and insulating layers that form a capacitive stack 30, as described in more detail in FIG. 6 below.

In one or more embodiments integrated inductors 40, 50 also exhibit the properties of high frequency (500 MHz-20 GHz) filters. This is implemented by way of the laminated stack 40 drawing upon the physical phenomenon of ferromagnetic resonance (FMR). FMR arises from the precessional motion of the (usually quite large) magnetization M of a ferromagnetic material in an external magnetic field H. The magnetic field exerts a torque on the sample magnetization which causes the magnetic moments in to precess. The precession frequency of the magnetization depends on the orientation of the material, the strength of the magnetic field H.

The FMR acts as an effective notch filter. In signal processing, a band-stop or band-rejection filter is a filter that passes most frequencies unaltered but attenuates those in a specific range to very low levels. It is the opposite of a band-pass filter. A notch filter is a band-stop filter with a narrow stopband (high Q factor).

In this function, an electrical conductor is magnetically coupled to the magnetic laminated structure, in a similar manner as an inductor. The interaction between the electrical conductor and the magnetic laminated stack is designed to efficiently pass (not attenuate) any spectral content traveling along the conductive trace except for at the particular frequency of ferromagnetic resonance. A magnetic field bias may be applied to the magnetic laminated structure, either with an integrated spiral or non-integrated source. The magnetic field bias enables the frequency of ferromagnetic resonance to be tuned. A combination of these FMR notch filters may be used to produce stopband and passband filters.

FIG. 6 is an illustration of laminations of magnetic material 61, 63, 65 that are electrically coupled with primary and secondary terminals 68, 69 for electric charge storage effecting a capacitive stack 60. In some embodiments, laminations of magnetic material 61, 63, 65 are in electrical communication (e.g., in direct or indirect connection) with primary and secondary terminals 68, 69. In some embodiments, laminations of magnetic material 61, 63, 65 are in electrical contact (e.g., in direct physical contact) with primary and secondary terminals 68, 69. In addition to the inductance enhancement that is provided by the magnetic laminations, the electrical insulating layer(s) 66 between magnetic laminations 61, 63, 65 is used to store an electric field. (An optional interface layer 67 may also be included.) A primary conductive terminal 68 is electrically coupled to alternating magnetic laminations 61, 63, etc. through an electrical conductor interconnect 62. Similarly, a secondary conductive terminal 69 is electrically coupled to all other magnetic laminations 65 et al. through electrical conductor interconnect 64. Primary conductive terminal 68 and secondary conductive terminal 69 are a cross-section of an electrical winding that wraps around the capacitive stack 30 to form an inductor as described above. In some embodiments, the capacitive stack 60 includes similar layers to the laminated plurality stack 30 described above.

\=This configuration forms one or more parallel plate capacitors because the magnetic materials employed in the laminated structure are electrically conductive. For the case of multiple laminations, the total capacitance available from this device can be especially high producing N−1 parallel plate capacitors that are electrically coupled in parallel, where N is the total number of magnetic laminations. The capacitance available from the present embodiment is useful for the output capacitance in switch-mode DC-DC power converters, as well as many other suitable applications.

FIG. 7 graphically illustrates the juxtaposition of hysteresis loops for the hard and soft axes in a soft ferromagnetic material. Suitable soft magnetic materials employed in one or more embodiments comprise alloys containing at least one of Co, Ni or Fe, which are anisotropic in their magnetic response. Magnetic anisotropy is the directional dependence of a material's magnetic properties. In the absence of an applied magnetic field, a magnetically isotropic material has no preferential direction for its magnetic moment, while a magnetically anisotropic material will align its moment with one of the easy axes in the presence of an applied magnetic field.

An easy axis is an energetically favorable direction of spontaneous magnetization. The two opposite directions along an easy axis are usually equivalent, and the actual direction of magnetization can be along either of them. In the context of the present invention, there exists a hard axis of magnetization and an easy axis of magnetization in the plane of the film (i.e., magnetic laminations). Along the easy axis, the material tends to exhibit a higher coercivity and a highly non-linear relationship between applied magnetic field and magnetization. This is in contrast with the hard axis, which tends to exhibit lower coercivity and maintain a relatively linear relationship between applied magnetic field and magnetization.

Due to the low coercivity and linearity in magnetization, it is desirable to utilize the hard axis for most applications. In the case of an inductor, this would involve aligning the orientation of the hard axis with the expected orientation of magnetic field lines that originate from the inductor winding. The hard axis orientation can be controlled by applying a DC magnetic field along the desired orientation of the easy axis, and heating the film to over 100 degrees Celsius. The magnitude of the applied magnetic field should be of equal or greater magnitude than the saturation field of the hard axis. The saturation field of the hard axis, which is the magnetic field that saturates the magnetization along the hard axis, is the same as the induced anisotropy of the material.

Patterned magnetic films, like those in the present invention, the induced anisotropy must overcome the shape anisotropy, or demagnetizing field ($H_{shape}$), in order for the magnetic film to maintain the desired orientation of anisotropy. Shape anisotropy is determined by the shape of the patterned film. For thin films, the magnitude of the demagnetizing field can be approximated as:

$$H_{shape} \sim M(N_w - N_l)$$

where, M is the material's saturation magnetization, and $N_w$-$N_l$ are the patterned films width and length, respectively. Thus, a film with high permeability will have low induced anisotropy, assuming constant saturation magnetization. In applications where a high permeability is required, it may be difficult to achieve the desired orientation of anisotropy for specific geometries where the shape anisotropy exceeds the induced anisotropy.

In one or more embodiments, two magnetic laminations comprise different materials and consequently different magnetic properties. The first material has high permeability (relative permeability exceeding 500μ). The second material exhibits induced anisotropy that is sufficient to overcome the expected shape anisotropy (greater than 10 $O_e$, but more likely greater than 20 $O_e$). The two material are placed in immediate proximity to each other such that they are stacked and being separated by an insulating and/or non-magnetic layer with less than 100 nm separation and greater than 1 nm separation. Configured thereto, the two films achieve dipolar coupling and the ensemble provides a combination of high permeability and controllable anisotropy. With separation greater than 100 nm, dipolar coupling between the two films may not occur, and an insulating layer with thickness less than 1 nm will likely have pin-holes that would allow for exchange coupling, which is undesirable for this application.

The two-layer combination of materials provides a higher permeability than would be achieved by the material with high induced anisotropy alone. Correspondingly, it also provides a higher induced anisotropy than would be achieved by the high permeability material alone. The relative thickness of the two layers can be optimized so that the induced anisotropy is sufficient to overcome the shape anisotropy of a given design, albeit with very little margin. The optimal permeability is achieved while maintaining control over the orientation of the hard axis. Increasing the thickness of the high induced anisotropy layer increases the induced anisotropy of the dipolar coupled lamination pair. The pair of laminations may be duplicated, one or more times, in order to achieve a thicker magnetic film overall while maintaining a lamination thickness that suppresses eddy currents over a desired range of frequency.

Fabricating one or more embodiments entails successive deposition of magnetic, insulating and interface layers. They can be performed by electrodeposition, physical vapor deposition or other suitable means. Layers are deposited onto the integrated circuit or a planar substrate proximal (less than 100 um) to an electrically coupled integrated circuit. After deposition of the complete film of electrically insulated laminations of magnetic material, they are covered with a masking layer that protects desired areas of the magnetic film. Other areas are left exposed so material may be selectively removed by a wet chemical etch. This forging yields magnetic films with specific geometries that are transferred through the mask. A dry chemical etch may remove the magnetic material, insulating and interface layers without much discrimination.

Another method for fabricating one or more embodiments entails successive deposition of magnetic, insulating and interface layers by electrodeposition. Layers are deposited onto the integrated circuit or a planar substrate proximal (less than 100 um) to an electrically coupled integrated circuit. The substrate is then covered with a conductive seed layer that is deposited by physical vapor deposition. This seed layer is then covered with a photoimageable polymer masking layer that is not electrically conductive. Portions of the substrate where growth of the magnetic film is not desired are coated with the polymer so that electrodeposition is conducted through the mask. This process yields magnetic films with specific geometries that are transferred through the mask.

FIG. 8 illustrates electrical couplings 82, 84, 87 to individual magnetic laminations 81, 85, 88 with VIAs to produce an integrated capacitor stack 80 according to an alternate embodiment with alternating layers of different material compositions. Power ingresses and egresses through primary and secondary terminals 83, 86.

A method of electrically coupling to the alternating magnetic layers to provide charge storage comprises lithographically patterned interconnect layers. The magnetic film is patterned by a subtractive wet or dry etch process that is optimized to yield a shallow sidewall profile on the magnetic film. The shallow sidewall allows the individual magnetic layers of the magnetic film to be exposed and accessed by vertical interconnect accesses (VIAs). Using multiple VIAs and interconnect layers, each of the magnetic films is electrically coupled to the appropriate electrical terminal.

FIG. 9 illustrates an exemplary method for fabricating a laminated, integrated device 90.

Fabrication comprises depositing and patterning the magnetic film 93, 94 by physical vapor deposition (PVD) and subtractive etching. This may also be performed by electrodeposition through a non-conductive mask. The film then undergoes an oxidation process so that the exposed areas of the magnetic film are oxidized. Insulating oxide magnetic materials 97, 98, 99 prevent electrical shorting between electrical connectors 91, 92. The two different material compositions for the alternating layers are chosen so that different electrically insulating oxides are formed during the oxidation process.

For example, one layer may be composed primarily of cobalt and consequently cobalt oxide forms, while the adjacent layer may be composed primarily of iron and consequently iron oxide forms. The patterned magnetic film structure is masked in a photoimageable polymer so that a strip of the sidewall is exposed. The substrate is then subjected to an etchant that more selectively etches the oxide of the primary magnetic material than the secondary magnetic material, removing the oxide of the primary magnetic material and exposing those laminations. A conductive interconnect layer is then deposited over the strip, which electrically couples all laminations composed of the primary material. The patterned magnetic film structure is masked in a photoimageable polymer so that a strip of the sidewall is exposed for the secondary magnetic material.

The substrate is subjected to an etchant that more selectively etches the oxide of the secondary magnetic material than the primary magnetic material, removing the oxide of the secondary magnetic material and exposing those laminations. A conductive interconnect layer is now deposited over the strip, which electrically couples all laminations composed of the secondary material. The two conductive interconnect layers that connect to the primary and secondary laminations independently may be routed to with additional interconnect layers. The resultant device provides both enhanced permeability for inductive elements and a reservoir for electric charge storage.

The embodiments described and illustrated herein are not meant by way of limitation, and are rather exemplary of the kinds of features and techniques that those skilled in the art might benefit from in implementing a wide variety of useful products and processes. For example, in addition to the applications described in the embodiments below, those skilled in the art would appreciate that the present disclosure can be applied to other applications.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present invention is directed upon review of the present disclosure.

What is claimed is:

1. A structure comprising:
   a semiconductor integrated circuit comprising a multilevel wiring network; and
   an inductor integrated into said multilevel wiring network, wherein said inductor comprises a planar laminated magnetic core and a conductive winding that turns around in a generally spiral manner on the outside of said planar laminated magnetic core, said planar laminated magnetic core comprising an electrical insulator layer and a first interface layer, wherein the electrical insulator layer and the first interface layer are disposed between a first magnetic layer and a second magnetic layer, and wherein said first interface layer comprises at least one of tantalum, titanium, tungsten, chromium, or platinum.

2. The structure of claim 1 wherein said electrical insulator is configured to reduce eddy currents.

3. The structure of claim 1 wherein said first magnetic layer is in electrical communication with a primary terminal and said second magnetic layer is in electrical communication with a secondary terminal.

4. The structure of claim 3, said planar laminated magnetic core further comprising a third magnetic layer in electrical communication with said primary terminal, said second magnetic layer disposed between said first magnetic layer and said third magnetic layer.

5. The structure of claim 4, said planar laminated magnetic core further comprising a second electrical insulator layer and a second interface layer, wherein the second electrical insulator layer and the second interface layer are disposed between said second magnetic layer and said third magnetic layer, and wherein said second interface layer comprises at least one of tantalum, titanium, tungsten, chromium, or platinum.

6. The structure of claim 3, said planar laminated magnetic core further comprising a fourth magnetic layer in electrical communication with said secondary terminal, said third magnetic layer disposed between said second magnetic layer and said fourth magnetic layer.

7. The structure of claim 6, said planar laminated magnetic core further comprising a third electrical insulator layer and a third interface layer, wherein the third electrical insulator layer and the third interface layer are disposed between said third magnetic layer and said fourth magnetic layer, and wherein said third interface layer comprises at least one of tantalum, titanium, tungsten, chromium, or platinum.

8. The structure of claim 1 wherein the first magnetic layer comprises a primary magnetic material having a relative permeability greater than about 500µ.

9. The structure of claim 1 wherein the second magnetic layer comprises a secondary magnetic material having an induced anisotropy greater than about 10 $O_e$.

10. The structure of claim 2 wherein the electrical insulator layer has an electrical resistivity of greater than about 500 microOhm-centimeters.

11. The structure of claim 1 wherein the first magnetic layer is comprised of a first material and the electrical insulator layer is comprised of an oxide of the first material.

12. The structure of claim 1 wherein said first interface layer comprises a material that is selected to reduce a roughness at an interface between said electrical insulator layer and said first magnetic layer, said reduced roughness causing a reduced magnetic coercivity of said magnetic core.

13. The structure of claim 1 wherein said first interface layer comprises a material that is selected to improve an adhesion at an interface between said electrical insulator layer and said first magnetic layer, said improved adhesion causing a reduced potential for film delamination at said interface.

14. The structure of claim 1 wherein said first interface layer serves as a diffusion barrier between said electrical insulator layer and said first magnetic layer, said diffusion barrier preventing a diffusion of material constituents between said electrical insulator layer and said first magnetic layer.

15. The structure of claim 1 wherein said interface layer comprises a material that is selected to reduce a mechanical film stress in said magnetic core.

16. The structure of claim 1, said planar laminated magnetic core further comprising a second interface layer, wherein:
said first interface layer is disposed between said electrical insulator layer and said first magnetic layer;
said second interface layer is disposed between said electrical insulator layer and said second magnetic layer; and
said second interface layer comprises at least one of tantalum, titanium, tungsten, chromium, or platinum.

17. The structure of claim 16 wherein:
said first interface layer serves as a first diffusion barrier between said electrical insulator layer and said first magnetic layer, said first diffusion barrier preventing a diffusion of material constituents between said electrical insulator layer and said first magnetic layer; and
said second interface layer serves as a second diffusion barrier between said electrical insulator layer and said second magnetic layer, said second diffusion barrier preventing a diffusion of material constituents between said electrical insulator layer and said second magnetic layer.

18. The structure of claim 16 wherein:
said first interface layer comprises a material that is selected to improve an adhesion at a first interface between said electrical insulator layer and said first magnetic layer, said improved adhesion causing a reduced potential for film delamination at said first interface; and
said second interface layer comprises a material that is selected to improve an adhesion at a second interface between said electrical insulator layer and said second magnetic layer, said improved adhesion causing a reduced potential for film delamination at said second interface.

19. The structure of claim 16 wherein:
said first interface layer comprises a material that is selected to reduce a roughness at a first interface between said electrical insulator layer and said first magnetic layer; and
said second interface layer comprises a material that is selected to reduce a roughness at a second interface between said electrical insulator layer and said second magnetic layer,
said reduced roughness at said first and second interfaces causing a reduced magnetic coercivity of said magnetic core.

* * * * *